(12) United States Patent
Hagen

(10) Patent No.: US 6,980,116 B2
(45) Date of Patent: Dec. 27, 2005

(54) METHOD FOR FAILURE DETECTION IN A RADIO FREQUENCY DEVICE

(75) Inventor: Rodney Hagen, Lake in the Hills, IL (US)

(73) Assignee: Motorola, Inc., Schaumburg, IL (US)

( * ) Notice: Subject to any disclaimer, the term of this patent is extended or adjusted under 35 U.S.C. 154(b) by 396 days.

(21) Appl. No.: 10/324,505

(22) Filed: Dec. 20, 2002

(65) Prior Publication Data

US 2004/0119595 A1 Jun. 24, 2004

(51) Int. Cl.$^7$ .............................................. G08B 21/00
(52) U.S. Cl. ................ 340/653; 340/635; 340/661; 455/226.1; 455/226.3; 324/88; 324/765; 324/769; 361/91.5; 361/101; 327/81
(58) Field of Search .................. 340/635, 653, 340/644, 652, 646, 654, 660, 661; 455/226.1, 423, 425, 67.1; 324/158.1, 768, 769, 90, 88, 500, 91.1, 765, 91.2, 95, 92; 361/91.5, 100, 101, 98; 327/81, 580

(56) References Cited

U.S. PATENT DOCUMENTS

| | | | | |
|---|---|---|---|---|
| 3,737,887 A | * | 6/1973 | Wakamatsu et al. | 340/653 |
| 3,965,420 A | * | 6/1976 | Bennett | 324/765 |
| 4,039,945 A | * | 8/1977 | Ugolnikov et al. | 324/605 |
| 4,234,964 A | * | 11/1980 | Cieslak et al. | 455/226.1 |
| 4,454,503 A | * | 6/1984 | Konrad | 340/648 |
| 4,525,765 A | * | 6/1985 | Brajder | 361/88 |
| 4,801,878 A | * | 1/1989 | Peiffer et al. | 324/765 |
| 5,404,109 A | * | 4/1995 | Pribble et al. | 324/603 |
| 5,737,169 A | * | 4/1998 | Sellers | 361/98 |
| 5,929,650 A | * | 7/1999 | Pappert et al. | 324/763 |
| 5,987,312 A | * | 11/1999 | Dekker | 455/115.1 |
| 6,297,661 B1 | * | 10/2001 | Chen et al. | 324/769 |
| 6,330,143 B1 | * | 12/2001 | Maly et al. | 361/101 |

* cited by examiner

*Primary Examiner*—Daniel J. Wu
*Assistant Examiner*—Son Tang
(74) *Attorney, Agent, or Firm*—Valerie M. Davis

(57) ABSTRACT

A method for detecting a failure in a radio frequency (RF) device (200) that includes a transistor (210) having a first terminal at an RF input (220), a second terminal at an RF output (260), and a third terminal at an RF common (230). The method includes the steps of: detecting a first voltage at the first terminal; comparing the first voltage to a reference voltage; and determining whether the RF transistor (210) is operating in a normal state or a failed state as a function of whether the first voltage falls inside or outside of a predetermined threshold value of the reference voltage.

12 Claims, 2 Drawing Sheets

METHOD FOR FAILURE DETECTION IN A RADIO FREQUENCY DEVICE

FIELD OF THE INVENTION

The present invention relates generally to radio frequency (RF) devices, and more specifically to a method for detecting a failure in a RF transistor.

BACKGROUND OF THE INVENTION

Radio frequency (RF) devices, e.g., RF transistors, and RF power amplifiers ("PAs") containing RF transistors, are used in a wide variety of communications and other electronic applications, such as cellular handsets and base radio repeaters. RF power amplifiers are typically made up of one or more cascaded amplifier stages, each of which increases the level of the signal applied to the input of that stage by an amount known as the gain stage. Additionally each cascaded amplifier stage can be paralleled with another amplifier to increase the RF power output of the cascaded stage if needed. Ideally, the input to output transfer of each stage is linear, i.e., a perfect replica of the input signal increased in amplitude appears at the amplifier output. In reality, however, all power amplifiers have a degree of non-linearity in their transfer characteristics. This non-linearity is directly related to the level of signal distortion in the amplifier signal output, i.e., the more linear the amplifier, the less distortion is added to the signal.

RF device fault detection is needed so that the end user, e.g., the customer, can be notified that a particular field replaceable unit needs to be replaced. In the event of a paralleled RF device failure in a power amplifier, this notification is needed, for instance, to determine if the product operating with a failed RF device is producing distortion products in excess of requirements imposed by the Federal Communications Commission ("FCC"). If such products exceed FCC limits, the law is being violated and system performance for the user and other system operators will be degraded.

FIG. 1 illustrates a prior art power amplifier 100 configured for enabling the detection of a failed RF device that is included in the amplifier. Power amplifier 100 includes a transistor 110 that in this instance is a metal oxide semiconductor field effect transistor (MOSFET) but may also be some other transistor type such as a Bipolar Junction Transistor (BJT) or a Junction Field Effect Transistor (JFET). Power amplifier 100 also includes: a RF de-coupling device or Radio Frequency Choke ("RFC") 136 connected to the gate 105 of transistor 110 and a RFC 138 connected to the drain of transistor 110 that are both preferably inductors; a resistor 132 connected between RFC 138 and RFC 136; a resistor 134 connected between a common (ground) at a terminal 130 and the junction of resistor 132 and RFC 136; a resistor 140 connected between a voltage source V+ at a terminal 150 and the junction of resistor 132 and RFC 138; a differential amplifier 142 connected across resistor 140 and having an output swing from substantially close to V+ to substantially close to ground; an RF matching circuit 112 connected to the gate 105 of transistor 110 for receiving an RF input signal ("$RF_{IN}$") at a terminal 120; and a RF matching circuit 162 connected to the drain 107 of transistor 110 through which a matched and amplified RF output signal ("$RF_{OUT}$") is presented at a terminal 160. In addition, the source of transistor 110 is coupled to an RF common (ground) at terminal 130. Amplifier 100 is illustrated with one transistor for ease of discussion. However, those of ordinary skill in the art will realize that amplifier 100 may, for instance, have cascaded stages and be implemented with additional transistors.

A well-known method for sensing whether transistor 110 has failed is to sense or detect the current being drawn by the drain of transistor 110, for instance, through the generation of an "I-Monitor" signal at a terminal 170. Specifically, a differential voltage is measured across resistor 140 that is proportional to the current being drawn through it and that is a function of the drain current of transistor 110. This differential voltage is then buffered or amplified by the differential amplifier 142, which delivers the single ended (i.e. referenced to ground) "I-Monitor" voltage signal. Accordingly, the "I-Monitor" signal is a single ended voltage representation of the current through resistor 140. The "I-Monitor" signal can then be detected at terminal 170 and compared to a static reference to enable a determination to be made as to whether transistor 110 is operating in a normal state or whether it has failed.

The above method of detecting RF device failure is adequate if the RF device is operating in "class A" because the drain current does not change versus RF drive, thereby enabling the use of a static reference. However, operating in "class A" is usually prohibitive from a utility power and thermal perspective for high power PA's, i.e., amplifiers having an average power out of greater than a few watts. Therefore, most high power PAs operate in "class AB" where the drain or collector currents are proportional to drive. In a class AB operation (as well as with all other classes of operation, e.g., Class B, Class C, etc.) the "I-Monitor" voltage signal will change in approximate proportion to the RF drive since the current through resistor 140 is changing. Thus, with respect to RF devices operating in these latter classes of operations, the current draw in the RF device cannot typically be gauged against a static reference. This means that a static reference cannot typically be used to determine if a failure has occurred.

Therefore for all practical purposes, short of including circuitry in the PA device that detects power out and developing a massive look up table for each RF device (operating in other than Class A) that lists the current drawn as a function of power out, the "health" of the RF device may only be detected using the prior art method during a non-RF drive situation when the RF device is dekeyed so that its quiescent drain current ("Idq") can be detected and compared to a known value. Ideally, the PA should be frequently dekeyed so that this Idq measurement/comparison can be made. However some PAs operate in a continuously keyed mode, so the Idq measurement/comparison can only occur during maintenance windows, which are typically scheduled a substantial time apart from each other so as not to affect system availability. Thus, if an RF device failed during the time span between maintenance windows, the PA could potentially be operating in an illegal manner for quite some time before an RF device failure is detected.

In addition, this method can be troublesome to implement because resistor 140 may have to be adjusted to a larger value than desired to get a "usable" sensitivity out of differential amplifier 142. This is because operational amplifiers, such as differential amplifier 142, generally have too high of an input offset voltage error to accurately detect the bias level of a transistor. However, raising the value of resistor 140 to increase the sensitivity of differential amplifier 142 would have the adverse effect of causing a lower DC voltage to be coupled to the drain of transistor 110. This would decrease the maximum AC compliance as well as the efficiency of power amplifier 100, which is undesirable. A further shortcoming of detecting the bias level of transistor 110, besides not being very practical, is that it cannot be used with Class C or B designs since these designs do not draw a bias current to begin with.

Thus, there exists a need for a more effective and efficient method for detecting in real-time whether an RF device has failed and that can be used with an amplifier, operating in any class, without having to dekey the amplifier.

BRIEF DESCRIPTION OF THE FIGURES

A preferred embodiment of the invention is now described, by way of example only, with reference to the accompanying figures in which.

DETAILED DESCRIPTION OF THE PREFERRED EMBODIMENT

Figure 1:
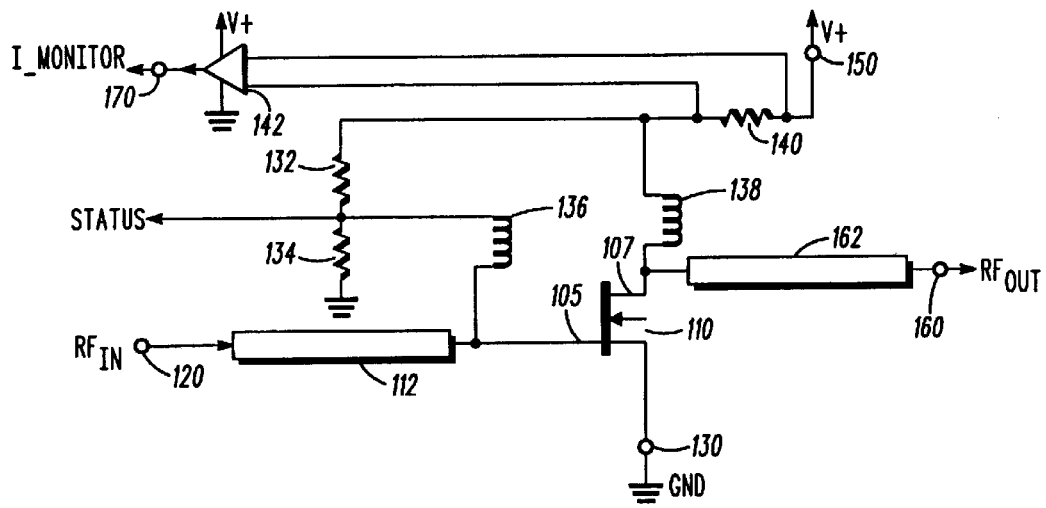
FIG. 1 illustrates a circuit diagram of a prior art power amplifier configured for enabling the detection of the status of an RF device included in the amplifier.

It will be appreciated that for simplicity and clarity of illustration, elements shown in the figures have not necessarily been drawn to scale. For example, the dimensions of some of the elements are exaggerated relative to each other. Further, where considered appropriate, reference numerals have been repeated among the figures to indicate corresponding elements.

Figure 2:
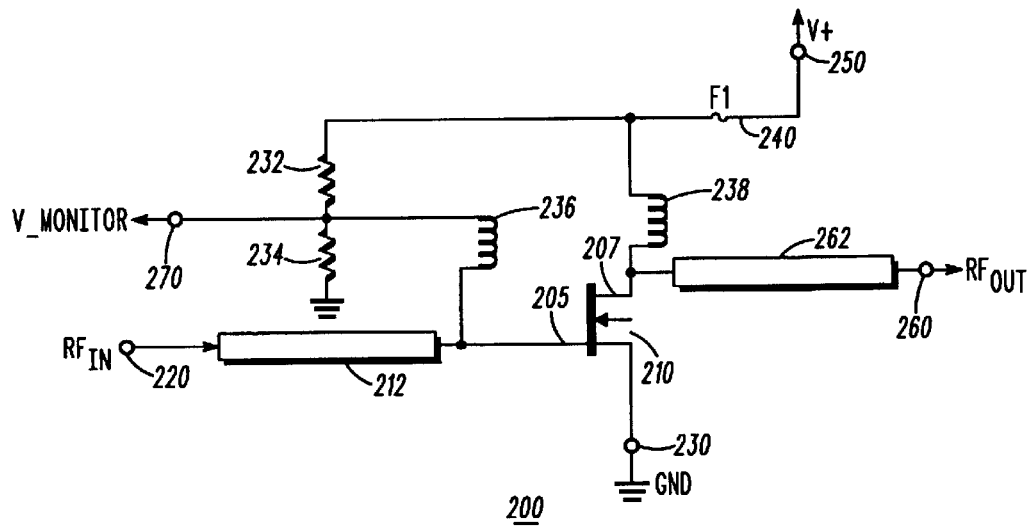
FIG. 2 illustrates a circuit diagram of a power amplifier configured for enabling the status of an RF device in the amplifier to be detected in accordance with the present invention.

This method of failure detection shown in FIG. 2 leverages off of the two ways a transistor will typically fail. One is a gate short and the second is a drain short. By looking for evidence of these two failure mechanisms one can detect a substantial majority of all device failures.

FIG. 2 illustrates a circuit diagram of a power amplifier 200 configured for enabling the status of an RF device in the amplifier to be detected in accordance with the present invention. Power amplifier 200 preferably includes a MOSFET transistor 210, a RF de-coupling device (RFC) 236 connected to the gate 205 of transistor 210 and a RFC 238 connected to the drain 207 of transistor 210 that are both preferably inductors, a resistor 232 connected between RFC 238 and RFC 236; a resistor 234 connected between a common (ground) at a terminal 230 and the junction of resistor 232 and RFC 236, a fuse 240 connected between a voltage source V+ at a terminal 250 and the junction of resistor 232 and RFC 238, an RF matching circuit 212 connected to the gate 205 of transistor 210 for receiving an RF input signal ($RF_{IN}$) at a terminal 220, and a RF matching circuit 262 connected to the drain 207 of transistor 210 through which a matched and amplified RF output signal ($RF_{OUT}$) is presented at terminal 260. In addition, the source of transistor 210 is coupled to an RF common (ground) at terminal 230. Amplifier 200 is illustrated with one transistor for ease of discussion. However, those of ordinary skill in the art will realize that amplifier 200 may also be implemented with additional transistors or with a different type of transistor, e.g., a BJT or a JFET.

By reference to power amplifier 200, the status of whether transistor 210 is operating in a normal state or a failed state is determined according to the present invention as follows. First, a voltage signal V-Monitor at the gate of transistor 110 is detected at terminal 270. The V-Monitor signal at terminal 270 can then be compared to a reference voltage, using a number of ways known in the art, for determining whether transistor 210 is operating in a normal state or in a failed state. Transistor 210 is operating in a normal state when the V-Monitor voltage signal is substantially equal to the voltage defined, "in this case", by the equation V+*(R234/(R234+ R232). The direct current (DC) impedance the RF MOSFET 210 can be negated because in an unfailed state its impedance is many orders of magnitude greater than the resistance of R234. It should be noted that in the preferred embodiment, the resistance of R234 should be designed such that it's impedance is less than two orders of magnitude the nominal DC impedance of the RF device.

Transistor 210 is operating in a failed state when there is a gate failure, a drain failure or a contemporaneous gate and drain failure. During a gate failure, the impedance seen at the gate of transistor 210 is substantially reduced, which lowers the V-Monitor voltage signal. During a drain short failure, fuse 240 will open, which lowers the V-Monitor voltage signal.

Whether transistor 210 is operating in a normal state or a failed state is, thus, determined by detecting the V-Monitor signal at terminal 270 and comparing it to a voltage reference, using any of a number of methods known in the art. The reference voltage should be set such that when V-monitor is compared to the reference voltage when transistor 210 is operating in a normal state, a status signal is generated that indicates that transistor 210 is operating in a normal state. Conversely, the reference voltage should be set such that when V-monitor is compared to the reference voltage when transistor 210 is operating in a failed state, a status signal is generated that indicates that transistor 210 is operating in a failed state. The reference voltage may be generated by a reference generator such as a resistive divider, a Zener regulator, a precision regulator IC, etc., in an analog approach. These devices, however, must derive there source voltage prior to fuse 240 (unprotected side). In a digital approach, the reference voltage may be stored in a memory device such as an EEPROM.

Once the status signal is generated, it can be used in a number of different ways. For instance, a microprocessor can monitor the status signal. If a failure is indicated on the status line the microprocessor can execute a protocol that will shut down the RF amplifier in a graceful fashion. Specifically, if any calls are being processed through the amplifier it will (if opted) wait until those calls are finished and not allow any new calls to be routed to the amplifier. Once all current calls have terminated, the amplifier will be shut down and a failure report can be generated to, for instance, a command center and service shop. In addition, the microprocessor could generate an error report to be delivered to the PA's non-volatile memory, which makes known which RF device failed. This would aid in a more rapid repair of the amplifier at the repair center since technicians would know the specific problem. In addition, a total analog solution could be implemented using the present invention, wherein no microprocessor is needed. In such a case, once a failure is noted in logic, the amplifier is immediately shut down in real time. All calls in progress would be immediately dropped. These are just two examples of implementation of the present invention, but more could be designed. Moreover, FIG. 4 and FIG. 5 illustrate two other implementations of the present invention.

Figure 3:
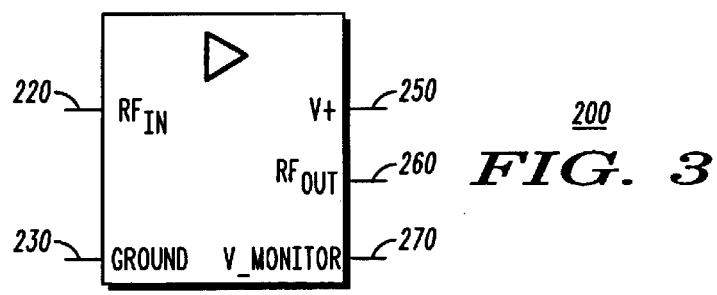
FIG. 3 illustrates a simple block diagram of the circuit illustrated in FIG. 2.

FIG. 3 illustrates a simple block diagram of the power amplifier 200 illustrated in FIG. 2. This block diagram of power amplifier 200 shows the terminal 220 for receiving $RF_{IN}$, the terminal 230 that couples the source of transistor 210 (FIG. 2) to ground, the terminal 250 connected to a voltage source V+, the terminal 260 at which a matched and amplified $RF_{OUT}$ is presented, and a terminal 270 at which the transistor 210 V-Monitor signal is generated.

Figure 4:
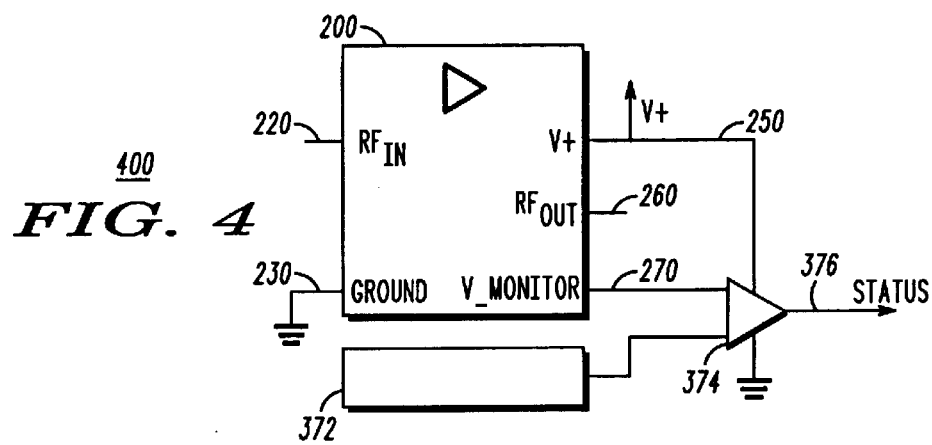
FIG. 4 illustrates a simple block diagram of an embodiment of the present invention when used to detect the failure of a non-paralleled RF stage amplifier device.

FIG. 4 illustrates a simple block diagram of an embodiment of the present invention when used to detect the failure of a RF device in a non-paralleled stage power amplifier network 400. Power amplifier network 400 includes a power amplifier 200 that is identical to the amplifier circuit described in FIG. 2 and the corresponding block diagram of FIG. 3. Power amplifier network 400 also includes a reference voltage source 372 and preferably an op-amp comparator 374 for detecting the V-Monitor signal at terminal 270 and comparing it to the reference 372 for generating a status signal 376 that indicates whether the RF device in amplifier 200 is operating in a normal state or a failed state.

Figure 5:
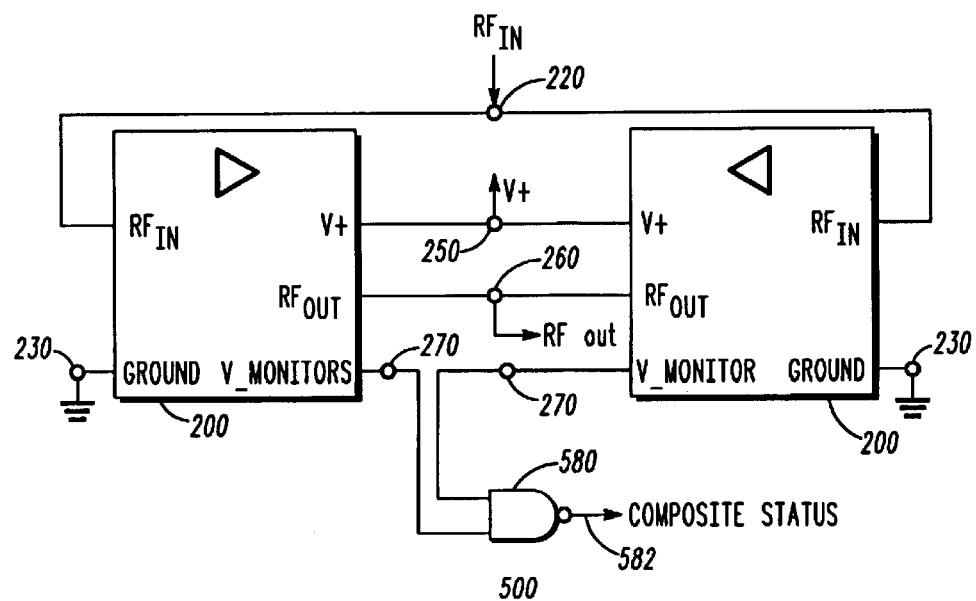
FIG. 5 illustrates a simple block diagram of another embodiment of the present invention when used to detect the failure of a paralleled RF stage amplifier device.

FIG. 5. illustrates a simple block diagram of an embodiment of the present invention when used to detect the failure of a RF device in a paralleled stage power amplifier network 500. Power amplifier network 500 includes two power amplifiers 200 that are each identical to the amplifier circuit described in FIG. 2 and the corresponding block diagram of FIG. 3. Both amplifiers are connected such as to have common terminals 220 for receiving $RF_{IN}$, common terminals 230 that couple the source of internal transistors (not shown) to ground, common terminals 250 connected to a voltage source V+, and common terminals 260 at which a matched and amplified $RF_{OUT}$ is presented.

PA network 500 also includes a logic element 580 coupled to the power amplifiers 200 for detecting their respective V-Monitor voltage signals for generating a status signal 582 that indicates whether the RF device in either or both amplifiers 200 is operating in a normal state or a failed state. The status signal 582 can then be used, for instance, to excite an indicator to feed to a processing unit to perform a more useful function.

The logic element 580 shown in FIG. 5 should be chosen such that the nominal biasing voltage V-Monitor will constitute a "high state" to the input of this logic element. If V-Monitor is higher than the allowable limit for the logic element then the bias voltage can be appropriately divided down to meet high-level limit restrictions. In the event of a RF device failure the V-Monitor signal will fall to a level that constitutes an input low to the logic element. In addition, logic element 580 should be chosen such that if all "high state" inputs are delivered to said logic element, then the output of the said logic device will reflect a different logic state than if any one or more of the input signals go to a "low state".

Referring again to FIG. 5, an op-amp comparator as was used in the circuit illustrated in FIG. 4 could alternatively be coupled to each power amplifier 200 for detecting the respective V-Monitor signals at terminal 270. In this embodiment, the output status signal of each op-amp could then be combined via a logic element 580 as described above.

There are several advantages of the present invention which provide significant improvement over the prior art method discussed by FIG. 1. One, the present invention will detect a device failure in a "class AB" PA during excitation.

Another advantage of the present invention over the prior art is that even if operational amplifier technology is improved, the prior art method cannot be used for Class C or B designs, since these designs do not draw a bias current. However, the present invention could be used to detect a RF device failure in a Class C or B design since it looks at the first terminal voltage (V-Monitor) of the RF device.

Yet another advantage of the present invention is that no maintenance period is required for continually keyed PA's.

A further advantage of the present invention is that it allows the use of single ended detection circuits as opposed to differential detection.

Another advantage of the present invention is that no bulky metering shunts are required for RF device failure detection.

Yet another advantage of the present invention is that it is easier to integrate a circuit that uses the present invention into a single RF integrated circuit.

A final advantage of the present invention is that it provides "real time" failure detection.

While the invention has been described in conjunction with specific embodiments thereof, additional advantages and modifications will readily occur to those skilled in the art. The invention, in its broader aspects, is therefore not limited to the specific details, representative apparatus, and illustrative examples shown and described. Various alterations, modifications and variations will be apparent to those skilled in the art in light of the foregoing description. Thus, it should be understood that the invention is not limited by the foregoing description, but embraces all such alterations, modifications and variations in accordance with the spirit and scope of the appended claims.

What is claimed is:

1. A method for detecting a failure in a radio frequency (RF) device that includes a transistor having a first terminal at an RF input, a second terminal at an RF output, and a third terminal at an RF common, said method comprising the steps of:
    detecting a first voltage at said first terminal;
    comparing said first voltage to a reference voltage;
    determining whether said transistor is operating in a normal state or a failed state as a function of whether said first voltage falls inside or outside of a predetermined threshold value of said reference voltage.

2. The method of claim 1, wherein said reference voltage is generated by a reference generator.

3. The method of claim 1, wherein said reference voltage is stored as an analog representation in the contents of an EEPROM.

4. The method of claim 1 further comprising the step of generating a status signal that indicates whether said RF device is operating in said normal state or said failed state.

5. The method of claim 4, wherein said status signal is generated by a logic device.

6. The method of claim 4, wherein said status signal is generated by a microprocessor.

7. The method of claim 4 further comprising the step of causing an action to be taken as a function of said status signal.

8. The method of claim 4 further comprising the step of combining said status signal with at least one other status signal for processing in a logic device.

9. The method of claim 4 further comprising the step of combining said status signal with at least one other status signal for processing in a microprocessor.

10. The method of claim 1, wherein said transistor is a MOSFET transistor.

11. The method of claim 1, wherein said failed state indicates a first terminal failure.

12. The method of claim 1, wherein said failed state indicates a second terminal failure.

* * * * *